(12) United States Patent
Iwashita et al.

(10) Patent No.: US 10,571,802 B2
(45) Date of Patent: Feb. 25, 2020

(54) PHOTOCURABLE COMPOSITION FOR IMPRINT, METHOD OF PRODUCING CURED FILM, METHOD OF PRODUCING OPTICAL COMPONENT, METHOD OF PRODUCING CIRCUIT BOARD, AND METHOD OF PRODUCING ELECTRONIC COMPONENT

(71) Applicant: CANON KABUSHIKI KAISHA, Tokyo (JP)

(72) Inventors: Kazumi Iwashita, Kobe (JP); Toshiki Ito, Kawasaki (JP); Akiko Iimura, Utsunomiya (JP); Jun Kato, Yokohama (JP); Keiji Yamashita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/537,006

(22) PCT Filed: Dec. 15, 2015

(86) PCT No.: PCT/JP2015/006246
§ 371 (c)(1),
(2) Date: Jun. 16, 2017

(87) PCT Pub. No.: WO2016/098346
PCT Pub. Date: Jun. 23, 2016

(65) Prior Publication Data
US 2018/0017861 A1 Jan. 18, 2018

(30) Foreign Application Priority Data

Dec. 19, 2014 (JP) .................... 2014-257797

(51) Int. Cl.

| | |
|---|---|
| C08F 220/18 | (2006.01) |
| G03F 7/00 | (2006.01) |
| C08F 2/48 | (2006.01) |
| H01L 21/027 | (2006.01) |
| H01L 21/311 | (2006.01) |
| G03F 7/029 | (2006.01) |
| G03F 7/027 | (2006.01) |
| G03F 7/031 | (2006.01) |
| C08F 222/10 | (2006.01) |
| H01J 37/30 | (2006.01) |
| H05K 3/00 | (2006.01) |

(52) U.S. Cl.
CPC .............. *G03F 7/0002* (2013.01); *C08F 2/48* (2013.01); *C08F 220/18* (2013.01); *C08F 222/1006* (2013.01); *G03F 7/0005* (2013.01); *G03F 7/027* (2013.01); *G03F 7/029* (2013.01); *G03F 7/031* (2013.01); *H01J 37/30* (2013.01); *H01L 21/0271* (2013.01); *H01L 21/311* (2013.01); *C08F 2220/1841* (2013.01); *C08F 2220/1875* (2013.01); *C08F 2222/102* (2013.01); *H05K 3/0011* (2013.01)

(58) Field of Classification Search
CPC .............. C08F 220/18; C08F 2222/102; C08F 2222/1875; C08F 2220/1841; C08F 226/06; C08F 2/48; G03F 7/0002; G03F 7/0005; G03F 7/031; G03F 7/029; G03F 7/027

See application file for complete search history.

(56) References Cited

U.S. PATENT DOCUMENTS

| | | | |
|---|---|---|---|
| 2010/0092727 A1 | 4/2010 | Uchida | |
| 2013/0011618 A1 | 1/2013 | Desimone | |
| 2016/0215074 A1* | 7/2016 | Honma | ..................... C08F 2/50 |

FOREIGN PATENT DOCUMENTS

| | | |
|---|---|---|
| CN | 105493236 A | 4/2016 |
| JP | 2007-084625 A | 4/2007 |
| JP | 2010-114209 A | 5/2010 |
| JP | 2011-222732 A | 11/2011 |
| JP | 2013-086294 A | 5/2013 |
| JP | 2014-237632 A | 12/2014 |
| KR | 10-2013-0004599 A | 1/2013 |
| WO | 2013/080741 A1 | 6/2013 |
| WO | 2013/162049 A1 | 10/2013 |
| WO | 2014/084395 A1 | 6/2014 |
| WO | 2014/157228 A1 | 10/2014 |
| WO | 2015/030151 A1 | 3/2015 |
| WO | WO-2015170465 A1 * | 11/2015 ................ C08F 2/50 |

OTHER PUBLICATIONS

Hiroshima, H., "Quick Cavity Filling in UV Nanoimprint Using Pentafluoropropane", Japanese Journal of Applied Physics, 2008, pp. 5151-5155, vol. 47, No. 6.

* cited by examiner

*Primary Examiner* — Sanza L. McClendon
(74) *Attorney, Agent, or Firm* — Canon U.S.A. Inc., IP Division

(57) ABSTRACT

The present invention relates to a photocurable composition for imprint in a condensable gas atmosphere. The composition at least includes a polymerizable compound component (A) and photopolymerization initiator component (B) and satisfies the Requirement (1):

a value $E_{CG}$ of greater than or equal to 2.30 GPa, where $E_{CG}$ denotes the reduced modulus (GPa) of a photocured film prepared by exposing the photocurable composition for imprint to light at an exposure dose of 200 mJ/cm² in an atmosphere containing a condensable gas in a concentration of 90% by volume or more.

22 Claims, 2 Drawing Sheets

FIG. 1A  STEP [1]  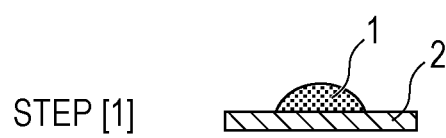
FIG. 1B  STEP [2]  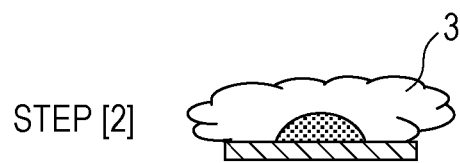
FIG. 1C  STEP [2]  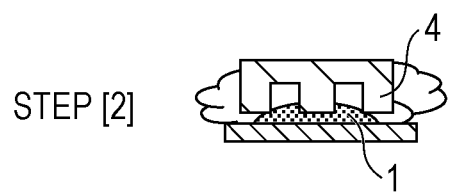
FIG. 1D  STEP [2]  
FIG. 1E  STEP [3]  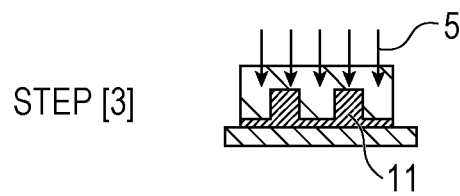
FIG. 1F  STEP [4]  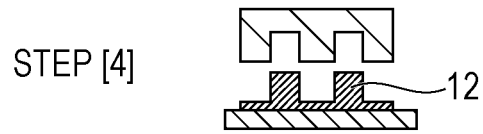
FIG. 1G  STEP [5]  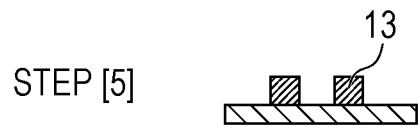
FIG. 1H  STEP [6]  

PHOTOCURABLE COMPOSITION FOR IMPRINT, METHOD OF PRODUCING CURED FILM, METHOD OF PRODUCING OPTICAL COMPONENT, METHOD OF PRODUCING CIRCUIT BOARD, AND METHOD OF PRODUCING ELECTRONIC COMPONENT

CROSS-REFERENCE TO RELATED APPLICATIONS

This application is a National Stage filing of International Application No. PCT/JP2015/006246 filed Dec. 15, 2015, which claims the benefit of Japanese Patent Application No. 2014-257797, filed Dec. 19, 2014, the disclosures of each of which are hereby incorporated by reference herein in their entirety.

TECHNICAL FIELD

The present invention relates to a photocurable composition for imprint, a method of producing a cured film, a method of producing an optical component, a method of producing a circuit board, and a method of producing an electronic component.

BACKGROUND ART

Demands for miniaturization of, for example, semiconductor devices and micro-electro-mechanical-systems (MEMSs) have been increasing. Recently, in addition to photolithography techniques, a microfabrication technique, which forms a pattern on a resist (photocurable composition) arranged on a substrate, such as a wafer, with a mold and forms a cured resist pattern on the substrate by light irradiation, has been getting much attention. The technique is called a photo-imprint technique and also is called a photo-nanoimprint technique because this technique can form nanometer scale fine structures on substrates. In photo-imprint, first, a resist is applied to a pattern-forming region on a substrate. Subsequently, the resist is brought into contact with a mold having a relief pattern on the surface. The resist is cured by irradiation with light, and the mold is then removed from the cured product. As a result, a photo-cured product having a relief pattern is formed on the substrate.

PTL 1 discloses an imprint method in which resist droplets are discretely arranged on a substrate by an ink jet system. In this method, the resist spreads by abutting contact with a mold and infiltrates into the gaps between the substrate and the mold or into the recesses of the mold. Thus, the gaps and the recesses are filled with the resist. However, the gas among the droplets that have spread may remain as bubbles. The resist curing with bubbles remaining therein has a problem of producing a photocured product having an unintended shape.

PTL 2 discloses a use of a condensable gas that condenses by a capillary pressure generated by infiltration of a resist into the gaps between a substrate and a mold or the recesses on the mold. The condensable gas introduced between the mold and the substrate reduces its volume by condensation after the supply of the resist and accelerates the disappearance of the remaining bubbles. The condensable gas mentioned in PTL 2 is trichlorofluoromethane ($CFCl_3$).

NPL 1 describes an improvement in filling ability by using 1,1,1,3,3-pentafluoropropane ($CHF_2CH_2CF_3$) as a condensable gas.

CITATION LIST

Patent Literature

PTL 1: Japanese Patent Laid-Open No. 2010-114209
PTL 2: Japanese Patent Laid-Open No. 2007-084625

Non Patent Literature

NPL 1: Japanese Journal of Applied Physics, Vol. 47, No. 6, 2008, pp. 5151-5155

SUMMARY OF INVENTION

Technical Problem

It has been, however, revealed that the use of a condensable gas in the photo-imprint as described above easily causes defects, such as pattern destruction, compared to the process not using any condensable gas.

The present invention has been made for solving the above-described problems, and the object of the invention is to provide a photocurable composition that can form a photocured film having a pattern having substantially no defects after curing by photo-imprinting in a condensable gas atmosphere.

Solution to Problem

The present invention provides a photocurable composition for imprint in a condensable gas atmosphere. The photocurable composition at least includes a polymerizable compound component (A) and a photopolymerization initiator component (B) and satisfies the Requirement (1):

a value $E_{CG}$ of greater than or equal to 2.30 GPa, where $E_{CG}$ denotes the reduced modulus (GPa) of a photocured film prepared by exposing the photocurable composition for imprint to light at an exposure dose of 200 mJ/cm$^2$ in an atmosphere containing a condensable gas in a concentration of 90% by volume or more.

Further features of the present invention will become apparent from the following description of exemplary embodiments with reference to the attached drawings.

Advantageous Effects of Invention

The present invention can provide a film having a pattern having substantially no defects, an optical component, a circuit board, and an electronic component by an imprint technique in a gaseous atmosphere containing a condensable gas.

BRIEF DESCRIPTION OF DRAWINGS

FIG. 1A is a schematic cross-sectional view illustrating a step of an example of a method of producing a film according to an embodiment of the present invention.

FIG. 1B is a schematic cross-sectional view illustrating another step of the method.

FIG. 1C is a schematic cross-sectional view illustrating another step of the method.

FIG. 1D is a schematic cross-sectional view illustrating another step of the method.

FIG. 1E is a schematic cross-sectional view illustrating another step of the method.

FIG. 1F is a schematic cross-sectional view illustrating another step of the method.

FIG. 1G is a schematic cross-sectional view illustrating another step of the method.

FIG. 1H is a schematic cross-sectional view illustrating another step of the method.

DESCRIPTION OF EMBODIMENTS

Figure 2A:
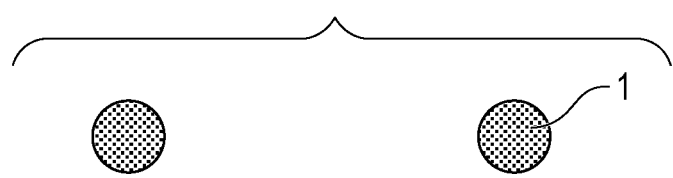
FIG. 2A is a plan view illustrating a state of the photocurable composition 1 for imprint in the arrangement step (1).

Embodiments of the present invention will now be described in detail with appropriate reference to the drawings. The present invention is, however, not limited to the embodiments described below, and the embodiments can be appropriately modified or improved within a scope not departing from the gist of the present invention on the basis of knowledge of those skilled in the art. Such modifications and improvements are also encompassed in the present invention.

Photocurable Composition for Imprint

The photocurable composition for imprint of this embodiment at least includes a component (A) being a polymerizable compound and a component (B) being a photopolymerization initiator.

In the embodiment, the term "photocurable composition for imprint" refers to a composition that is polymerized and cured by irradiation with light, and the terms "photocured product" and "photocured film" refer to those produced by curing the photocurable composition for imprint with light.

The present inventors have diligently studied and, as a result, have found as a first embodiment that a pattern having substantially no defects, such as pattern destruction, can be formed even in imprint in a gaseous atmosphere containing a condensable gas by using a photocurable composition for imprint satisfying the Requirement (1):

a value $E_{CG}$ of greater than or equal to 2.30 GPa.

where $E_{CG}$ denotes the reduced modulus (GPa) of a photocured film prepared by exposing the photocurable composition for imprint to light at an exposure dose of 200 mJ/cm$^2$ in an atmosphere containing a condensable gas in a concentration of 90% by volume or more.

The photocurable composition for imprint can further satisfy the Requirement (2): a value $E_{CG}$ of greater than or equal to 2.43 GPa.

As a second embodiment of the composition for photoimprint according to the present invention, the inventors have also found that a pattern having substantially no defects, such as pattern distinction, can be formed even in imprint in a gaseous atmosphere containing a condensable gas by using a photocurable composition for imprint satisfying the Requirement (3):

a ratio $E_{CG}/E_{NCG}$ of 0.65 or more and 1.1 or less, where $E_{NCG}$ denotes the reduced modulus (GPa) of a photocured film prepared by exposing the photocurable composition for imprint to light in a non-condensable gas atmosphere.

Each component will now be described in detail.

Component (A): Polymerizable Compound

The component (A) is a polymerizable compound. In the embodiment and the present invention, the term "polymerizable compound" refers to a compound that reacts with a polymerizing factor (e.g., radical) generated from a photopolymerization initiator (component (B)) and forms a film of a polymer compound through a chain reaction (polymerization reaction).

Examples of the polymerizable compound include radical polymerizable compounds. The polymerizable compound component (A) may be composed of one polymerizable compound or of two or more polymerizable compounds.

The radical polymerizable compound can be a compound having one or more acryloyl or methacryloyl groups, i.e., can be a (meth)acrylic compound.

Accordingly, the polymerizable compound can include a (meth)acrylic compound and further can be mainly composed of a (meth)acrylic compound. Furthermore, the component (A) can be composed of a (meth)acrylic compound alone. Herein, the description of that the polymerizable compound is mainly composed of a (meth)acrylic compound refers to that 90% by weight or more of the polymerizable compound is a (meth)acrylic compound.

A radical polymerizable compound composed of a plurality of compounds each having one or more acryloyl or methacryloyl groups can include a monofunctional acrylic monomer and a multifunctional acrylic monomer. A combination of a monofunctional acrylic monomer and a multifunctional acrylic monomer can provide a cured film having a high strength.

Examples of the monofunctional (meth)acrylic compound having one acryloyl or methacryloyl group include, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumyl phenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, 1-naphthylmethyl (meth)acrylate, 2-naphthylmethyl (meth)acrylate, tetrahydrofurfuryl (meth)acrylate, butoxyethyl (meth)acrylate, ethoxydiethylene glycol (meth)acrylate, polyethylene glycol mono (meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, isobutoxymethyl (meth)acrylamide, N,N-dimethyl (meth)acrylamide, t-octyl(meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of the commercial products of the monofunctional (meth)acrylic compound include, but not limited to, Aronix series M101, M102, M110, M111, M113, M117, M5700, TO-1317, M120, M150, and M156 (manufactured by Toa Gosei Co., Ltd.), MEDOL10, MIBDOL10, CHDOL10, MMDOL30, MEDOL30, MIBDOL30, CHDOL30, LA, IBXA, 2-MTA, HPA, Viscoat series #150, #155, #158, #190, #192, #193, #220, #2000, #2100, and #2150 (manufactured by Osaka Organic Chemical Industry Ltd.), Light Acrylate series BO-A, EC-A, DMP-A, THF-A, HOP-A, HOA-MPE, HOA-MPL, PO-A, P-200A, NP-4EA, and NP-SEA, and Epoxy Ester M-600A (manufactured by Kyoeisha Chemical Co., Ltd.), KAYARAD TC110S, R-564, and R-128H (manufactured by Nippon Kayaku Co., Ltd.), NK Ester series AMP-10G and AMP-20G (manufactured by Shin-Nakamura Chemical Co., Ltd.), FA-511A, 512A, and 513A (manufactured by Hitachi Chemical Co., Ltd.), PHE, CEA, ME-2, PHE-4, BR-31, BR-31M, and BR-32 (manufactured by Daiich Kogyo Seiyaku Co., Ltd.), VP (manufactured by BASF), and ACMO, DMAA, and DMAPAA (manufactured by Kohjin Co., Ltd.).

Examples of the multifunctional (meth)acrylic compound having two or more acryloyl or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethylol tricyclodecane di(meth)acrylate, pentaerythritol ti(meth)acrylate, pentaerythritol tetra(meth)acrylate, ethylene glycol di(meth)acrylate, tetraethylene glycol di(meth)acrylate, phenylpropylene glycol di(meth)acrylate, phenylethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantanedimethanol di(meth)acrylate, o-xylylene di(meth)acrylate, m-xylylene di(meth)acrylate, p-xylylene di(meth)acrylate, tris(2-hydroxy ethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of the commercial products of the multifunctional (meth)acrylic compound include, but not limited to, Yupimer UV series SA1002 and SA2007 (manufactured by Mitsubishi Chemical Corp.), Viscoat series #195, #230, #215, #260, #335HP, #295, #300, #360, and #700, GPT, and 3PA (manufactured by Osaka Organic Chemical Industry, Ltd.), Light Acrylate series 4EG-A, 9EG-A, NP-A, DCP-A, BP-4EA, BP-4PA, TMP-A, PE-3A, PE-4A, and DPE-6A (manufactured by Kyoeisha Chemical Co., Ltd.), KAYARAD series PET-30, TMPTA, R-604, DPHA, and DPCA-20, -30, -60, and -120, HX-620, D-310, and D-330 (manufactured by Nippon Kayaku Co., Ltd.), Aronix series M208, M210, M215, M220, M240, M305, M309, M310, M315, M325, and M400 (manufactured by Toa Gosei Co., Ltd.), and Ripoxy series VR-77, VR-60, and VR-90 (manufactured by Showa Denko K.K.).

In the above-mentioned compound groups, the term "(meth)acrylate" refers to acrylate and its corresponding methacrylate having an alcohol residue; the term "(meth)acryloyl group" refers to an acryloyl group and its corresponding methacryloyl group having an alcohol residue; the term "EO" refers to ethylene oxide, and the term "EO-modified compound A" refers to a compound in which the (meth)acrylic acid residue and the alcohol residue of the compound A are bound to each other via a block structure of an ethylene oxide group; and the term "PO" refers to propylene oxide, and the term "PO-modified compound B" refers to a compound in which the (meth)acrylic acid residue and the alcohol residue of the compound B are bound to each other via a block structure of a propylene oxide group.

Among these compounds, the component (A) can include at least one and further at least two selected from isobornyl acrylate, benzyl acrylate, dicyclopentanyl acrylate, dicyclopentenyl acrylate, phenylethylene glycol diacrylate represented by the following Formula (4), and m-xylylene diacrylate represented by the following Formula (5).

[Chem. 1]

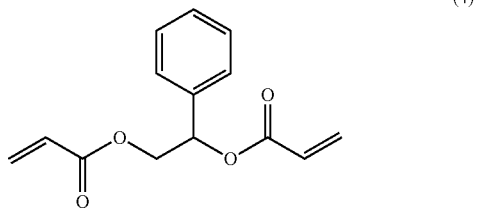

(4)

[Chem. 2]

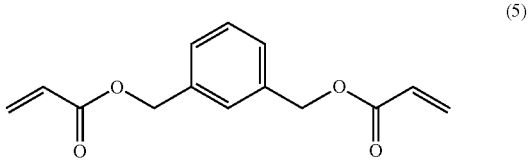

(5)

Component (B): Photopolymerization Initiator

The component (B) is a photopolymerization initiator.

In the embodiment and the present invention, the photopolymerization initiator is a compound that detects light of a predetermined wavelength and generates the above-described polymerizing factor (radical). Specifically, the photopolymerization initiator is a polymerization initiator (radical generator) generating radicals by light (infrared rays, visible rays, ultraviolet rays, far ultraviolet rays, X-rays, charged particle rays such as electron beams, or radiation rays).

The component (B) may be composed of one photopolymerization initiator or may be composed of two or more photopolymerization initiators.

Examples of the radical generator include, but not limited to, optionally substituted 2,4,5-triarylimidazole dimers, such as a 2-(o-chlorophenyl)-4,5"diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives, such as benzophenone, N,N'-tetramethyl-4,4'-diaminobenzophenone (Michler's ketone), N,N-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives, such as 2-benzyl-2-dimethylamino-1-(4-morpholinophenyl)-butanone-1,2- methyl-1-[4-(methyl thio)phenyl]-2-morpholino-propanon-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin derivatives, such as benzoin, methyl benzoin, ethyl benzoin, and propyl benzoin; benzyl derivatives, such as benzyl dimethyl ketal; acridine derivatives, such as 9-phenyl acridine and 1,7-bis(9,9'-acridinyl)heptane; N-phenylglycine derivatives, such as N-phenylglycine; acetophenone derivatives, such as acetophenone, 3-methylacetophenone, acetophenone benzyl ketal, 1-hydroxycyclohexylphenyl ketone, and 2,2-dimethoxy-2-phenylacetophenone; thioxanthone derivatives, such as thioxanthone, diethylthioxanthone, 2-isopropylthioxanthone, and 2-chlorothioxanthone; xanthones; fluorenones; benzaldehydes; fluorenes; anthraquinones; triphenylamines; carbazoles; and 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, bis(2,4,6-trimethylbenzoyl)phenylphosphine oxide, bis(2,6-dimethoxybenzoyl)-2,4,4-trimethylpentylphosphine oxide, 1,2-octanedion, 1-[4-(phenylthio)-,2-(O-benzoyloxime)], and ethanone, 1-[9-ethyl-6-(2-methylbenzoyl)-9H-carbazol-3-yl]-,1-(O-acetyloxime).

Examples of the commercial products of the photoradical generator include, but not limited to, Irgacure series 184, 369, 651, 500, 819, 907, 784, and 2959, CGI-1700, -1750, and -1850, CG24-61, and Darocur series 1116 and 1173, Lucirin TPO, LR8893, and LR8970 (manufactured by BASF), and Uvecryl P36 (manufactured by UCB).

Among these photoradical generators, an alkylphenone polymerization initiator or an acylphosphine oxide polymerization initiator can be particularly used as the component (B).

In the above-mentioned examples, the alkylphenone polymerization initiators are benzoin ether derivatives, such as benzoin methyl ether, benzoin ethyl ether, and benzoin phenyl ether; benzoin derivatives, such as benzoin, methyl benzoin, ethyl benzoin, and propyl benzoin; benzyl derivatives, such as benzyl dimethyl ketal; acetophenone derivatives, such as acetophenone, 3-methylacetophenone, acetophenone benzyl ketal, 1-hydroxycyclohexylphenyl ketone, and 2,2-dimethoxy-2-phenylacetophenone; and α-amino aromatic ketone derivatives, such as 2-benzyl-2-dimethylamino-1-(4-morpholinophenyl)-butanone-1 and 2-methyl-1-[4-(methylthio)phenyl]-2-morpholine-propanon-1-one.

In the above-mentioned examples, the acylphosphine oxide polymerization initiators are acylphosphine oxide compounds, such as 2,4,6-trimethylbenzoyldiphenyllphosphine oxide, bis(2,4,6-trimethylbenzoyl)phenylphosphine oxide, and bis(2,6-dimethoxybenzoyl)-2,4,4-trimethylpentylphosphine oxide.

Among these photoradical generators, the component (B) can be particularly 2,4,6-trimethylbenzoyldiphenylphosphine oxide represented by the following Formula (6) or 2-benzyl-2-dimethylamino-1-(4-morpholinophenyl)-butanone-1 represented by the following Formula (7):

[Chem. 3]

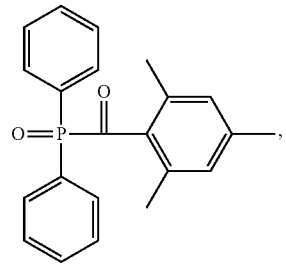

(6)

[Chem. 4]

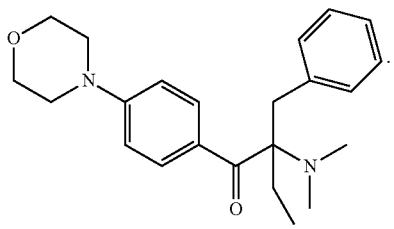

(7)

The content of the polymerization initiator component (B) in the photocurable composition for imprint is 0.01% by weight or more and 10% by weight or less, preferably 0.1% by weight or more and 7% by weight or less, based on the total weight of the polymerizable compound component (A).

A content of the component (B) of 0.01% by weight or more based on the total weight of the polymerizable compound accelerates the curing rate of the composition and can increase the reaction efficiency. A content of the component (B) of 10% by weight or less based on the total weight of the polymerizable compound can provide a cured product having a certain degree of mechanical strength.

Component (C): Other Additional Components

The photocurable composition for imprint in the embodiment may further include, in addition to the components (A) and (B) described above, a component (C) depending on the purposes within a range that does not impair the effects of the present invention. Examples of the additional component (C) include surfactants, sensitizers, hydrogen donors, antioxidants, solvents, and polymer components.

The sensitizer is a compound that is optionally added to the composition for accelerating the polymerization reaction or improving the reaction conversion rate. The sensitizer is, for example, a sensitizing dye.

The sensitizing dye is a compound that is excited by absorbing light of a specific wavelength and interacts with the polymerization initiator component (B). The interaction herein is, for example, energy transfer or electron transfer from the sensitizing dye in the excited state to the polymerization initiator component (B).

Examples of the sensitizing dye include, but not limited to, anthracene derivatives, anthraquinone derivatives, pyrene derivatives, perylene derivatives, carbazole derivatives, benzophenone derivatives, thioxanthone derivatives, xanthene derivatives, coumarin derivatives, phenothiazine derivatives, camphorquinone derivatives, acridine dyes, thiopyrylium salt dyes, merocyanine dyes, quinoline dyes, stvrvlquinoline dyes, ketocoumarin dyes, thioxanthene dyes, xanthene dyes, oxonol dyes, cyanine dyes, rhodamine dyes, and pyrylium salt dyes.

The sensitizers may be used alone or in combination of two or more thereof.

Among these examples, the sensitizer can be particularly a benzophenone sensitizer.

In the above-mentioned examples, the benzophenone sensitizers are benzophenone compounds such as 4,4'-bis(dialkylamino)benzophenone.

Among the above-mentioned examples, the sensitizer can be particularly 4,4'-bis(diethylamino)benzophenone represented by the following Formula (8):

[Chem. 5]

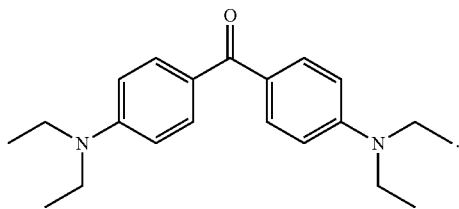

(8)

The hydrogen donor is a compound that reacts with initiating radicals generated from the polymerization initiator component (B) or radicals on the polymerization growth terminals and generates radicals having higher reactivity. The hydrogen donor can be added to the composition including a photo-radical generator as the polymerization initiator component (B).

Examples of the hydrogen donor include, but not limited to, amine compounds, such as N-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylamino benzoate, triethanolamine, and N-phenylglycine; and mercapto compounds, such as 2-mercapto-N-phenylbenzimidazole and mercapto-propionic acid ester.

The hydrogen donors may be used alone or in combination of two or more thereof.

The hydrogen donor may have a function as a sensitizer. Examples of the hydrogen donor having a function as a sensitizer include 4,4'-bis(dialkylamino)benzophenone mentioned above.

Examples of the 4,4'-bis(dialkylamino)benzophenone include 4,4'-bis(diethylamino)benzophenone and its derivatives.

When the photocurable composition for imprint of the embodiment includes a sensitizer or a hydrogen donor as the additional component, the amount thereof is preferably 0% by weight or more and 20% by weight or less, more preferably 0.1% by weight or more and 5.0% by weight or less, and most preferably 0.2% by weight or more and 2.0% by weight or less, based on the total weight of the polymerizable compound component (A). A sensitizer in an amount of 0.1% by weight or more based on the total weight of the component (A) can more effectively accelerate the polymerization. A content of 5.0% by weight or less of a sensitizer or hydrogen donor can provide a sufficiently large molecular weight to the polymer compound forming photocured products, and can prevent insufficient dissolution of the additional components in the photocurable composition for imprint and prevent deterioration in the storage stability of the photocurable composition for imprint.

The photocurable composition for imprint can include a surfactant for reducing the interface bonding force between a mold and a resist.

The surfactant can be a silicone surfactant or a fluorine surfactant. Among these surfactants, from the viewpoint of an excellent effect of reducing the mold-releasing force, a fluorine surfactant can be used. In the present invention, the surfactant is not polymerizable.

Examples of the fluorine surfactant include polyalkylene oxide adducts of alcohols having perfluoroalkyl groups (such as polyethylene oxide or polypropylene oxide adducts) and polyalkylene oxide adducts of perfluoropolyethers (such as polyethylene oxide or polypropylene oxide adducts). The fluorine surfactant may have a hydroxyl group, an alkyl group, an amino group, a thiol group, or another group in its molecular structure (for example, as the terminal group). The surfactant may be a commercial product.

Examples of the commercial product of the fluorine surfactant include Megafac series F-444, TF-2066, TF-2067, and TF-2068 (manufactured by DIC Corporation), Fluorad series FC-430 and FC-431 (manufactured by Sumitomo 3M Limited), Surflon S-382 (manufactured by Asahi Glass Co., Ltd.), EFTOP series EF-122A, 122B, 122C, EF-121, EF-126, EF-127, and MF-100 (manufactured by Tohchem Products Co., Ltd.), PF-636, PF-6320, PF-656, and PF-6520 (manufactured by OMNOVA Solutions Inc.), Unidyne series DS-401, DS-403, and DS-451 (manufactured by Daikin Industries, Ltd.), and Ftergent series 250, 251, 222F, and 208G (manufactured by Neos Corporation).

The surfactant may be a hydrocarbon surfactant.

Examples of the hydrocarbon surfactant include polyalkylene oxide adducts of alkyl alcohols prepared by adding alkylene oxides having 2 to 4 carbon atoms to alkyl alcohols having 1 to 50 carbon atoms.

Examples of the polyalkylene oxide adducts of alkyl alcohols include an ethylene oxide adduct of methyl alcohol, an ethylene oxide adduct of decyl alcohol, an ethylene oxide adduct of lauryl alcohol, an ethylene oxide adduct of cetyl alcohol, an ethylene oxide adduct of stearyl alcohol, and an ethylene oxide/propylene oxide adduct of stearyl alcohol. The terminal group of the polyalkylene oxide adduct of alkyl alcohol is not limited to a hydroxyl group, which can be produced by simply adding a polyalkylene oxide to alkyl alcohol. The hydroxyl group may be replaced by another substituent, e.g., a polar functional group, such as a carboxyl group, an amino group, a pyridyl group, a thiol group, or a silanol group, or a hydrophobic functional group, such as an alkyl group.

The polyalkylene oxide adduct of alkyl alcohol may be a commercial product. Examples of the commercial product include polyoxyethylene methyl ether (ethylene oxide adduct of methyl alcohol) manufactured by Aoki Oil Industrial Co., Ltd. (BLAUNON MP-400, BLAUNON MP-550, and BLAUNON MP-1000): polyoxyethylene decyl ether (ethylene oxide adduct of decyl alcohol) manufactured by Aoki Oil Industrial Co., Ltd. (FINESURF D-1303, FINESURF D-1305, FINESURF D-1307, and FINESURF D-1310); polyoxyethylene lauryl ether (ethylene oxide adduct of lauryl alcohol) manufactured by Aoki Oil Industrial Co., Ltd. (BLAUNON EL-1505); polyoxyethylene cetyl ether (ethylene oxide adduct of cetyl alcohol) manufactured by Aoki Oil Industrial Co., Ltd. (BLAUNON CH-305 and BLAUNON CH-310); polyoxyethylene stearyl ether (ethylene oxide adduct of stearyl alcohol) manufactured by Aoki Oil Industrial Co., Ltd. (BLAUNON SR-705, BLAUNON SR-707, BLAUNON SR-715, BLAUNON SR-720, BLAUNON SR-730, and BLAUNON SR-750);

polyoxyethylene polyoxypropylene stearyl ether prepared by random polymerization manufactured by Aoki Oil Industrial Co., Ltd. (BLAUNON SA-50/50 1000R. and SA-30/70 2000R); polyoxyethylene methyl ether manufactured by BASF Japan Ltd. (Pluriol A760E); and polyoxyethylene alkyl ether manufactured by Kao Corporation (Emulgen series).

Among these hydrocarbon surfactants, the internal releasing agent can be a polyalkylene oxide adduct of alkyl alcohol, in particular, a polyalkylene oxide adduct of long-chain alkyl alcohol.

The surfactants may be used alone or in combination of two or more thereof.

When the photocurable composition for imprint of the embodiment includes a surfactant as an additional component, the content of the surfactant is, for example, 0.001% by weight or more and 10% by weight or less, preferably 0.01% by weight or more and 7% by weight or less, and more preferably 0.05% by weight or more and 5% by weight or less, based on the total weight of the polymerizable compound component (A). A surfactant content within a range of 0.001% by weight or more and 10% by weight or less can reduce the mold-releasing force and also provide an excellent filling ability to the photocurable composition for imprint.

The photocurable composition for imprint of the embodiment can be a composition for photo-nanoimprint.

The ratios of component (A) and component (B) can be determined by analyzing the photocured product prepared by exposing the photocurable composition for imprint of the embodiment to light by, for example, infrared spectroscopy, ultraviolet-visible spectroscopy, or pyrolytic gas chromatography mass spectrometry. As a result, the ratios of component (A) and component (B) in the photocurable composition for imprint can be determined.

Temperature of Photocurable Composition for Imprint at the Time of Blending

The photocurable composition for imprint of the embodiment is prepared by mixing and dissolving at least component (A) and component (B) at a predetermined temperature, specifically, within a range of 0° C. or more and 100° C. or less.

Viscosity of Photocurable Composition for Imprint

The mixture of the components, excluding the solvent, of the photocurable composition for imprint of the embodiment preferably has a viscosity of 1 mPa*s or more and 100 mPa*s or less at 23° C., more preferably 5 mPa*s or more and 50 mPa*s or less, and most preferably 5 mPa*s or more and 12 mPa*s or less.

The photocurable composition for imprint having a viscosity of 100 mPa*s or less can be filled in the recesses of the fine pattern on a mold, without taking a long time, when it has been brought into contact with the mold and also hardly causes a pattern defect due to filling failure.

The photocurable composition for imprint having a viscosity of 1 mPa*s or more hardly causes uneven coating when it is applied onto a substrate and hardly flows out from the end of a mold when it is brought into contact with the mold.

Surface Tension of Photocurable Composition for Imprint

The mixture of the components, excluding the solvent, of the photocurable composition for imprint of the embodiment preferably has a surface tension of 5 mN/m or more and 70 mN/m or less at 23°, more preferably 7 mN/m or more and 35 mN/m or less, and most preferably 10 mN/m or more and 32 mN/m or less. The photocurable composition for imprint having a surface tension of 5 mN/m or more can be filled in the recesses of the fine pattern on a mold, without taking a long time, when it has been brought into contact with the mold.

The photocurable composition for imprint having a 70 mN/m or less can form a cured product having high surface smoothness by exposure dose to light.

Impurities in photocurable composition for imprint

The photocurable composition for imprint of the embodiment includes impurities as less as possible. Throughout the specification, the term "impurities" refers to those other than component (A), component (B), and the additional components described above.

Accordingly, the photocurable composition for imprint can be prepared by a process including a purification step, such as filtration through a filter.

The filtration with a filter can be specifically performed by filtering a mixture of component (A), component (B), and optional additional components described above through a filter having a pore diameter of 0.001 μm or more and 5.0 μm or less for example. The filtration through a filter can be multi-stage filtration or may be repeated multiple times. The filtrate may be re-filtered. The filtration may be performed through a plurality of filters having different pore diameters. Any filter can be used for the filtration. For example, a filter made of a polyethylene resin, polypropylene resin, fluorine resin, or nylon resin can be used.

Such a purification step can remove impurities such as particles mixed into the photocurable composition for imprint. As a result, a pattern default, which is caused by irregularities unexpectedly generated by impurities such as particles, can be prevented from occurring in the photocured product produced by irradiating the photocurable composition for imprint with light.

In a case of using the photocurable composition for imprint of the embodiment for producing a semiconductor integrated circuit, mixing of impurities (metal impurities) containing metal atoms into the photocurable composition for imprint should be prevented as much as possible, in order not to block the behavior of the product. In such a case, the concentration of metal impurities contained in the photocurable composition for imprint is preferably 10 ppm or less and more preferably 100 ppb or less.

Cured Film

A cured film can be formed by exposing a coating film formed from the photocurable composition for imprint to light. An example of the method of forming a coating film from the photocurable composition for imprint will be described below in the arrangement step (1) in a method of producing a film having a pattern. An example of the method of curing a coating film will be described below in the light irradiation step (4) of irradiating a photocurable composition for imprint with light in the method of producing a film having a pattern.

Measurement of Reduced Modulus of Cured Film

The reduced modulus of a cured film can be measured by, for example, nanoindentation. The nanoindentation is a method involving pushing of a penetrator into a desired place of a sample and simultaneously measuring the load and the displacement and can determine the solidity and the reduced modulus of the sample from the resulting load-displacement curve. Examples of the measuring apparatus include Nano indenter 6200 (manufactured by Agilent Technologies, Inc.), ENT series (manufactured by Elionix Inc.), and TI series (manufactured by Hysitron, Inc.).

The reduced modulus can be determined by an Oliver-Pharr method as a reduced modulus at an indentation depth of 200 nm with TI-950 TriboIndenter (manufactured by Hysitron, Inc.). In the exposure dose to light of 200 mJ/cm$^2$, the thickness of a film formed from the photocurable composition for imprint is adjusted to 3.2 μm on average. The reduced modulus of a cured film can be measured, for example, after 24 hours from the exposure dose of the film formed from the photocurable composition for imprint to light, Method of Producing Film Having Pattern A method of producing a film having a pattern of the embodiment will now be described.

FIGS. 1A to 1H are schematic cross-sectional views illustrating an example of a method of producing a film having a pattern of this embodiment.

The method of producing a film having a pattern of the embodiment includes:

an arrangement step (1) of arranging the photocurable composition for imprint of the embodiment described above on a substrate;

a mold contact step (2) of bringing the photocurable composition for imprint and a mold into contact with each other in a gaseous atmosphere containing a condensable gas;

a light irradiation step (3) of irradiating the photocurable composition or imprint with light; and a mold-releasing step (4) of detaching the cured product prepared in the step (3) from the mold.

The film prepared by the method of producing a film having a pattern of the embodiment can have a pattern preferably having a size of 1 nm or more and 10 mm or less and more preferably 10 nm or more and 100 μm or less. In general, a pattern-forming technique for producing a film having a nanosized (1 nm or more and 100 nm or less) pattern (indented structure) using light is called a photo-nanoimprint technique. The method of producing a film having a pattern of the embodiment utilizes the photo-nanoimprint technique.

Each step will now be described.

Arrangement Step (1)

This step (arrangement step) forms a coating film by, as shown in FIG. 1A, arranging (applying) the photocurable composition 1 for imprint of the embodiment described above on a substrate 2.)

The substrate 2 on which the photocurable composition 1 for imprint is arranged is a substrate to be machined and is usually a silicon wafer.

The substrate 2 is, however, not limited to silicon wafers and may be appropriately selected from known substrates for semiconductor devices, such as aluminum, titanium-tungsten alloy, aluminum-silicon alloy, aluminum-copper-silicon alloy, silicon oxide, and silicon nitride substrates. The substrate 2 (substrate to be machined) may be subjected to surface treatment, such as silane coupling treatment, silazane treatment, or formation of an organic thin film, for improving the adhesion with the photocurable composition for imprint.

The photocurable composition for imprint of the embodiment can be arranged on a substrate to be machined by, for example, ink jetting, dip coating, air knife coating, curtain coating, wire bar coating, gravure coating, extrusion coating, spin coating, or slit scanning. Though the thickness of the layer to be subjected to shape transfer (coating film) varies depending on the use, it can be, for example, 0.01 μm or more and 100.0 μm or less. In the photo-nanoimprint technique, ink jetting can be particularly used.

Mold Contact Step (2) of Bringing Composition Into Contact With Mold in Gaseous Atmosphere Containing Condensable Gas Subsequently, the coating film of the photocurable composition 1 formed in the previous step (arrangement step) is brought into contact with a mold having a mold pattern to be transferred in a gaseous atmosphere containing a condensable gas.

This step involves stages (2-1) to (2-3), as shown in FIGS. 1B to 1D.

Stage (2-1) of Supplying Condensable Gas-Containing Gas

First, in this stage (condensable gas-supplying stage), as shown in FIG. 1B, a gas 3 containing a condensable gas in a gaseous state is supplied to the surrounding of the photocurable composition 1 arranged on the substrate 2, at a pressure lower than the steam pressure or at a temperature higher than the boiling point, such that the surrounding of the photocurable composition 1 of the embodiment arranged on the substrate 2 becomes a gaseous atmosphere containing a condensable gas.

In the present invention and the specification, the term "condensable gas" refers to a gas that is in the gaseous state under the temperature and pressure conditions in the apparatus for producing photocured products having desired patterns and condenses (liquefies) under certain conditions in the contact stage (impression stage) (2-2) described below. The details of the certain conditions will be described later.

The condensable gas has a boiling point of −10° C. or more and 23° C. or less or has a vapor pressure at room temperature of 0.1 MPa or more and 0.4 MPa or less. Among such condensable gases satisfying these requirements, a condensable gas having boiling point of 10° C. or more and 23° C. or less can be particularly used.

The gas having a vapor pressure at room temperature of 0.4 MPa or less readily condenses by the capillary pressure generated by infiltration of the curable composition 1 into the gaps between the substrate 2 and the mold 4 or the recesses on the mold 4 and is liquefied to allow the bubbles to disappear. The gas having a vapor pressure at room temperature of 0.1 MPa or more is in a gaseous state in an apparatus, without requiring a reduction in pressure, which can prevent the apparatus from being complicated.

In general, the imprint region of a UV-curing imprint apparatus is used at room temperature. Any condensable gas having a boiling point lower than the temperature of the imprint region can be in a gaseous state by controlling the temperature during imprinting and can prevent the apparatus from being complicated. In the present invention and the specification, the term "room temperature" is defined to be 20° C. or more and 25° C. or less.

Examples of the condensable gas include freons, such as chlorofluorocarbon (CFC), fluorocarbon (FC), hydrochlorofluorocarbon (HUG) hydrofluorocarbon (HEC), and hydrofluoroether (HFE).

Among the freons, in particular, 1,1,1,3,3-pentafluoropropane ($CHF_2CH_2CF_3$, HFC-245fa, PFP) can be used. PFP has a vapor pressure of 0.14 MPa at 23° C., which is within room temperature, and a boiling point of 15° C.

These condensable gases may be used alone or in combination of two or more thereof.

The condensable gas-containing gas may be composed of a condensable gas only or may be gas mixture of a noncondensable gas, such as air, nitrogen, carbon dioxide, helium, or argon, and a condensable gas. In particular, the noncondensable gas that is mixed with a condensable gas can be helium, because helium is an inert gas that substantially does not block the polymerization of the component (B) described above and has a high filling ability. When the noncondensable gas is helium, the filling ability is high, because helium passes through the mold and does not form bubbles, and the mold surface are also thoroughly filled with the photocurable composition. Accordingly, the condensable gas-containing gas can be a gas mixture of 1,1,1,3,3-pentafluoropmpane and helium.

Stage (2-2) of Mold Contact

Subsequently, the mold 4 is brought into contact with the photocurable composition 1 (layer to be subjected to shape transfer) (FIG. 1C). This stage is also called impression stage. In the previous stage (Stage (2-1) of supplying condensable gas-containing gas), since the surrounding of the photocurable composition is in a gaseous atmosphere containing the condensable gas 3, this stage (contact stage) is performed in a gaseous atmosphere containing the condensable gas 3.

As shown in FIG. 1C, the mold 4 is brought into contact with the photocurable composition 1. Consequently, the photocurable composition 1 infiltrates into the gaps between the substrate 2 and the mold 4 and the recesses of the fine pattern on the surface of the mold 4.

On this occasion, the condensable gas 3 present in the gaps between the substrate 2 and the mold 4 and the recesses on the mold 4 condenses and liquefies by the pressure conditions that are received by the condensable gas during the infiltration of the photocurable composition 1 (the capillary pressure conditions generated by the infiltration of the photocurable composition 1). The condensation and liquefaction are also affected by the temperature conditions of this stage (contact stage).

Figure 2B:
FIG. 2B is a plan view illustrating a state of the photocurable composition 1 for imprint in the mold contact step (2).

The liquefaction of the condensable gas 3 reduces the volume of the condensable gas 3 present in the gaps between the substrate 2 and the mold 4 and the recesses on the mold 4 to one several hundredth. Thus, the volume is reduced to an infinitesimal level that is substantially equal to zero, and bubbles do not substantially occur in the fine pattern of the coating film formed from the photocurable composition 1, resulting in an improvement in the precision of the pattern transfer. When the condensable gas-containing gas is a mixture of a condensable gas and a noncondensable gas, the non-condensable gas is not liquefied and is dissolved in the photocurable composition 1 in the gaseous state or passes through the mold 4. In particular, when the noncondensable gas is helium, helium readily passes through the mold 4 because of its low molecular weight. FIGS. 2A and 2B are plan views illustrating the state of the photocurable composition 1 arranged in a mode (mode (1-1)) in which droplets of the photocurable composition 1 are arranged to be apart from one another in the arrangement step (1).

FIG. 2A is a diagram illustrating a state of the photocurable composition 1 in the arrangement step (1); and FIG. 2B is a diagram illustrating a state of the photocurable composition 1 in the mold contact step (2).

As shown in FIG. 2A, droplets of the photocurable composition 1 are arranged at three points spaced apart from one another, and a mold (not shown) is then brought into contact with the droplets. Each droplet of the photocurable composition 1 moves and diffuses. On this occasion, the condensable gas present on the point 1a at which two droplets that diffuse and form a thin film come into contact with each other and on the point 1b at which three droplets that diffuse and form a thin film come into contact with one another condenses and liquefies by the pressure from the droplets of the photocurable composition 1. As a result, bubbles are hardly generated at the points 1a and 1b.

The mold 4 should be made of a light transmissive material considering the subsequent step (light irradiation step). Examples of the light transmissive material or film for the mold 4 include glass, quartz, PMMA, light transmissive resins, such as polycarbonate resins, transparent metal vapor-deposited films, flexible films made of, e.g., polydimethylsiloxane, photocured films, and metal films. When a light transmissive resin is used for the mold 4, the resin should be a resin that is not dissolved in the solvent contained in the photocurable composition 1.

The mold 4 may be subjected to surface treatment, prior to the mold contact step of bringing the photocurable composition and the mold into contact with each other, for improving the detachability between the photocurable composition 1 and the surface of the mold 4. The surface treatment is performed by, for example, applying a mold release agent to the surface of the mold 4 to form a mold release agent layer. Examples of the mold release agent to be applied to the surface of the mold include silicon-based mold release agents, fluorine-based mold release agents, polyethylene-based mold release agents, polypropylene-based mold release agents, paraffin-based mold release agents, montan-based mold release agents, and camauba-based mold release agents. Commercially available application-type mold release agents, such as Optool DSX manufactured by Daikin Industries, Ltd., can also be used. These mold release agents may be used alone or in combination of two or more thereof. Among these agents, the fluorine-based mold release agents can readily reduce the mold-releasing force and can be particularly used.

The pressure for bringing the mold 4 and the photocurable composition 1 into contact is not particularly limited. Although the time of the contact is also not particularly limited, a shorter time of the contact may cause insufficient infiltration of the photocurable composition 1 into the gaps between the substrate 2 and the mold 4 and the recesses (fine pattern) on the mold 4, and a longer time of the contact may decrease the productivity.

A step of positioning the substrate and the mold in a condensable gas-containing atmosphere may be further performed.

Although the positioning step may be performed before the mold contact step, the step is usually performed after the mold contact step, i.e., in a state that the photocurable composition is in contact with both the mold and the substrate.

The positioning may be performed by a known process, for example, by providing markers having predetermined shapes for positioning to the substrate and the mold and optically observing the overlapping state of the markers.

Light Irradiation Step (3) of Irradiating Photocurable Composition for Imprint With Light Subsequently, as shown in FIG. 1E, light is irradiated, through the mold 4, to the contact region of the photocurable composition 1 with the mold 4, more specifically, to the fine pattern of the coating film formed from the photocurable composition 1 filled in the fine pattern 10 of the mold (FIG. 1D). As a result, the fine pattern 10 of the coating film filled in the fine pattern of the mold is cured into a cured film 11 by irradiation with light (irradiation light 5).

The light irradiated to the photocurable composition 1 forming the fine pattern 10 of the coating film filled in the fine pattern of the mold is selected depending on the sensitive wavelength of the photocurable composition 1. Specifically, the light is appropriately selected from, for example, ultraviolet light having a wavelength of 150 nm or more and 400 nm or less, X-rays, and electron rays.

The light (irradiation light 5) to be irradiated to the fine pattern 10 of the coating film can be particularly ultraviolet light, because many of commercially available curing aids (photopolymerization initiators) are compounds having sensitivity to ultraviolet light. Examples of light sources emitting ultraviolet light include high-pressure mercury lamps, ultra-high pressure mercury lamps, low-pressure mercury lamps, Deep-UV lamps, carbon arc lamps, chemical lamps, metal halide lamps, xenon lamps, KrF excimer lasers, ArF excimer lasers, and F, excimer lasers. In particular, the ultra-high pressure mercury lamps can be used. The light sources may be used alone or in combination. The coating film filled in the fine pattern of the mold may be entirely irradiated with light or may be partially irradiated with light.

The light irradiation may be intermittently performed multiple times for the entire region or may be continuously performed for the entire region. Furthermore, the light irradiation may be performed for a partial region A in a first irradiation step and for a region B different from the region A in a second irradiation step.

Mold-Releasing Step (4)

Subsequently, the cured film 11 and the mold 4 are detached from each other to form, on the substrate 2, a cured film 12 having a certain pattern.

In this step (mold-releasing step), as shown in FIG. 1F, the cured film 11 and the mold 4 are detached from each other to give a pattern inverted from the fine pattern on the surface of the mold 4 as the pattern formed on the cured film 12 in the step (3) (light irradiation step).

The cured film 11 and the mold 4 may be detached from each other by any method that does not physically damage a part of the cured film 11. The conditions for the detachment are not particularly limited. For example, the mold 4 may be detached by fixing the substrate 2 (substrate to be machined) and moving the mold 4 so as to separate from the substrate 2, by fixing the mold 4 and moving the substrate 2 so as to separate from the mold 4, or by pulling the both in the opposite directions.

The producing process involving the steps (1) to (4) can provide a cured film 12 having a desired relief pattern (based on the relief shape of the mold 4). The pattern interval of the relief pattern of the cured product 12 is determined by the pattern interval of the relief pattern on the surface of the mold 4.

The relief pattern formed on the surface of the mold 4 may have any pattern interval. Specifically, the pattern interval can be appropriately selected from millimeter scales, micrometer scales (including submicron scales), and nanometer scales. For example, in the formation of a relief pattern of a nanometer scale, the pattern can be formed at a pattern interval of 20 nm or less.

When the mold 4 is smaller than the area of the substrate 2, a part of the photocurable composition 1 arranged on the substrate 2 is not in contact with the mold 4. In such a case, the mold used is appropriately moved to different regions of the substrate 2, and the producing process involving the above-described steps (1) to (4) is performed at each of the regions. That is, a plurality of shots, each composed of the producing process involving the steps (1) to (4), is performed for the photocurable composition 1 arranged on the substrate 2. As a result, a plurality of cured products 12 each having a pattern based on the relief shape of the mold 4 can be formed on the substrate 2.

The resulting cured film 12 having a pattern can also be used as an optical member (including a case of being used as one member of an optical member), such as Fresnel lens or a diffraction grating. In such a case, an optical member at least including a substrate 2 and a cured film 12 having a pattern disposed on the substrate 2 can be provided.

Etching Step (5)

The cured film prepared in the step (4), i.e., the mold-releasing step, has a specific pattern and may also include a region in which the pattern has not been formed (hereinafter, such a region of the film may be called a remaining film). In such a case, as shown in FIG. 1G, the region (remaining film) of the cured film in the region that should be removed from the resulting cured film having a pattern is removed to give a cured product pattern 13 having a desired relief pattern (pattern shape based on the relief shape of the mold 4).

The remaining film can be removed by, for example, removing the recess regions (remaining film) of the cured film 12 having a pattern by a method, such as etching, to expose the surface of the substrate 2 at the recess regions of the pattern of the cured film 12.

The etching for removing the film at the recess regions of the pattern of the cured film 12 can be performed by any known method such as dry etching. The dry etching can be performed with a known dry etching apparatus. The source gas for dry etching is appropriately selected depending on the elemental composition of the cured film to be etched. Examples of the source gas include halogen gases, such as $CF_4$, $C_2F_6$, $C_3F_8$, $CCl_2F_1$, $CCl_4$, $CBrF_3$, $BCl_3$, $PCl_3$, $SF_6$, and $Cl_2$; oxygen-containing gases, such as $O_2$, CO, and $CO_2$; inert gases, such as He, $N_2$, and Ar; and gases, such as $H_2$ and $NH_3$. These gases may be used as a mixture thereof.

The producing process involving the steps (1) to (5) can provide a cured product pattern 13 having a desired relief pattern (based on the relief shape of the mold 4) and can provide an article having a cured product pattern. Furthermore, when the resulting cured product pattern 13 is used for processing the substrate 2, a substrate-processing step (step (6)) described below is performed.

Alternatively, the resulting cured product pattern 13 can be used as an optical member (including a case of using in one member of an optical member), such as a diffraction grating or a polarizing plate, to provide an optical component. In such a case, an optical component at least including a substrate 2 and a cured product pattern 13 on the substrate 2 can be provided.

Substrate-Processing Step (6)

The cured product pattern 13 having a relief pattern prepared by the method of producing a film having a pattern of the embodiment can also be used as an interlayer insulating film of an electronic component represented by a semiconductor device, such as an LSI, system LSI, DRAM, SDRAM, RDRAM, or D-RDRAM, or as a photocurable composition film in production of semiconductor devices.

In the case of using the cured product pattern 13 as a photocurable composition film, the region of the substrate where the surface has been exposed in the etching step (5) is etched or implanted with ions to form an electronic member. As a result, a circuit structure 20 (FIG. 1H) based on the pattern shape of the cured product pattern 13 can be formed on the substrate 2 and can be used in, for example, a semiconductor device. On this occasion, the cured product pattern 13 functions as an etching mask. The circuit board may be connected to a circuit controlling mechanism that controls the circuit board to form an electronic component (electronic device).

When a circuit board or an electronic component is produced, the cured product pattern 13 may be eventually removed completely from the processed substrate or may be left as a part of the member constituting a device.

EXAMPLES

The present invention will now be described in more detail by examples, but the technical scope of the present invention is not limited to the following examples. Note that "part(s)" and "%" used below are based on weight unless otherwise specified.

Example 1

(1) Preparation of Photocurable Composition (a-1) for Imprint

A component (A) and a component (B) shown below were mixed. The mixture was filtered through an ultra-high molecular weight polyethylene filter of a pore size of 0.2 μm to prepare a photocurable composition (a-1) for imprint.

(1-1) Component (A): 100 Parts by Weight in Total, Composed of:

A-1: dicyclopentanyl acrylate (manufactured by Hitachi Chemical Co., Ltd. trade name: FA-513AS): 50 parts by weight, and A-2: m-xylylene diacrylate represented by Formula (5) (manufactured by NARD institute, Ltd.): 50 parts by weight.

(1-2) Component (B): 3 Parts by Weight in Total, Composed of:

B-1: Lucirin TPO represented by Formula (6) (manufactured by BASF Japan Ltd.): 3 parts by weight.

[Chem. 6]

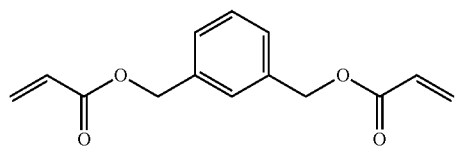

(5)

[Chem. 7]

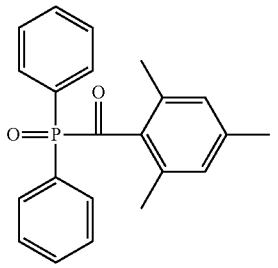

(6)

(1-3) Component (C): 0.5 parts by weight in total, composed of:

C-1: 4,4'-bis(diethylamino)benzophenone represented by Formula (8) (manufactured by Tokyo Chemical Industry Co., Ltd.): 0.5 parts by weight.

[Chem. 8]

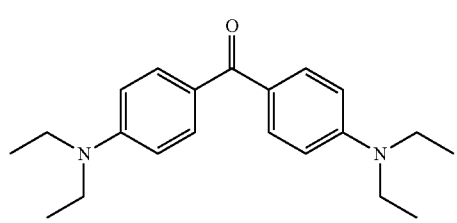

(8)

(2) Production of Cured Film of Photocurable Composition (a-1) for Imprint in Condensable Gas Atmosphere and Ice Non-Condensable Gas Atmosphere Cured films of the photocurable composition (a-1) for imprint were produced in a condensable gas atmosphere and in a non-condensable gas atmosphere by the following processes (2-1) and (2-2).

(2-1) Production of Cured Film of Photocurable Compositions for Imprint in Condensable Gas Atmosphere Two microliters of the photocurable composition (a-1) for imprint was dropwise applied onto a silicon wafer provided with an adhesion-accelerating layer having a thickness of 60 nm as an adhesion layer to form a coating film. The silicon wafer was placed in a chamber filled with a condensable gas, 1,1,1,3,3-pentafluoropropane (PFP), and PFP was further allowed to flow for 60 seconds. The coating film was then covered with quartz glass having a thickness of 1 mm to fill a region of 25×25 mm with the photocurable composition (a-1) for imprint. The chamber was filled with PFP again, and was then sealed. On this occasion, the oxygen concentration measured with an oxygen monitor (OxyMedy OXY-1S-M, manufactured by Jikco Ltd.) attached to the chamber was 0.0% by volume or less. The PFP concentration was therefore assumed to be 90% by volume or more.

Subsequently, the coating film was irradiated with light emitted from a UV light source equipped with a high-pressure mercury lamp and passed through an interference filter described below for 200 seconds through the quartz glass. The interference filter used in the light irradiation was VPF-25C-10-15-31300 (manufactured by Sigma Koki Co., Ltd.), and the ultraviolet light as the irradiation light had a single wavelength of 365±5 nm and an illumination of 1 mW/cm$^2$.

After the light irradiation, the quartz glass was removed to give a cured film (a-1-PFP) of the photocurable composition (a-1) for imprint exposed to light at an exposure dose of 200 mJ/cm$^2$ and having an average thickness of 3.2 μm on the silicon wafer.

(2-2) Production of Cured Film of Photocurable Composition for Imprint in Non-Condensable Gas Atmosphere As in the process (2-1), 2 μL of the photocurable composition (a-1) for imprint was dropwise applied onto a silicon wafer provided with an adhesion-accelerating layer having a thickness of 60 nm as an adhesion layer to form a coating film. The coating film was then covered with quartz glass having a thickness of 1 mm to fill a region of 25×25 mm with the photocurable composition (a-1) for imprint. On this occasion, the atmosphere was the air.

Subsequently, the coating film was irradiated with light emitted from UV light source equipped with a high-pressure mercury lamp and passed through an interference filter described below for 200 seconds through the quartz glass. The interference filter used in the light irradiation was VPF-25C-10-15-31300 (manufactured by Sigma Koki Co., Ltd.), and the ultraviolet light as the irradiation light had a single wavelength of 365±5 nm and an illumination of 1 mW/cm$^2$.

After the light irradiation, the quartz glass was removed to give a cured film (a-1-AIR) of the photocurable composition (a-1) for imprint exposed to light at an exposure dose of 200 mJ/cm$^2$ and having an average thickness of 3.2 μm on the silicon wafer.

(3) Measurement of Reduced Modulus of Cured Film

The composite moduli of elasticity of the resulting cured films (a-1-PFP) and (a-1-AIR) were measured after 24 hours from the light exposure dose with a nanoindenter (TI-950 TriboIndenter, manufactured by Hysitron, Inc.). The composite moduli of elasticity were each determined as an average of the composite moduli of elasticity measured by a quasi-static test, Oliver-Pharr analysis, at 15 points by pushing a penetrator by 200 nm in the depth direction from the surface of the cured film and measuring the reduced modulus at each point.

The reduced modulus $E_{CG}$ of the cured film (a-1-PFP) and the reduced modulus $E_{NCG}$ of the cured film (a-1-AIR) were 3.32 GPa and 3.82 GPa, respectively, and the ratio $E_{CG}/E_{NCG}$ was 0.87.

(4) Production and Observation of Nanoimprint Pattern

Subsequently, a nanoimprint pattern was formed using the photocurable composition (a-1) for imprint produced in a condensable gas atmosphere by the method shown below, and a 10 mm square region of the nanoimprint pattern was observed with an electron microscope.

(4-1) Production of Nanoimprint Pattern in Condensable Gas Atmosphere

In accordance with the producing process shown in FIGS. 1A to 1H, a nanoimprint pattern was formed using the photocurable composition (a-1) for imprint in an atmosphere of a gas mixture of 92% PFP as the condensable gas and 8% of the air, using NIM-80L RESO (manufactured by NTT Advanced Technology Corporation) as the mold and performing irradiation with light of 50 mW/cm² for 10 seconds with a UV light source SP-7 (manufactured by Ushio Inc.).

(4-2) Observation of Nanoimprint Pattern Using Electron Microscope

Observation of the nanoimprint pattern with an electron microscope demonstrated that the photocurable composition (a-1) for imprint formed a satisfactory nanoimprint pattern substantially not having pattern destruction at an exposure dose of 500 mJ/cm², The term "pattern destruction" refers to a state that a 70 nm line and space (US) pattern observed from directly above is not straight and is partially curved.

Example 2

(1) Preparation of Photocurable Composition (a-2) for Imprint

A photocurable composition (a-2) for imprint was prepared as in Example 1 except that the compound represented by Formula (7) was used as the component (B) and that the component (C) was not used.

B-2: Irgacure 369 (manufactured by BASF Japan Ltd.) represented by Formula (7): parts by weight.

[Chem. 9]

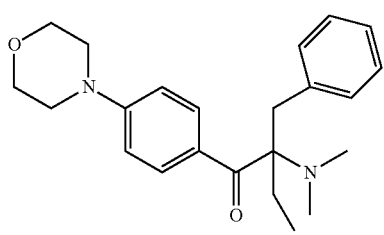

(7)

(2) Production of Cured Film of Photocurable Composition (a-2) for Imprint in Condensable Gas Atmosphere and in Non-Condensable Gas Atmosphere A cured film (a-2-PFP) and a cured film (a-2-AIR) were produced from the photocurable composition (a-2) for imprint as in Example 1 in a condensable gas atmosphere and in a non-condensable gas atmosphere, respectively.

(3) Measurement of Reduced Modulus of Cured Film

As in Example 1, the composite moduli of elasticity of the cured films (a-2-PFP) and (a-2-AIR) were measured. The reduced modulus $E_{CG}$ of the cured film (a-2-PFP) was 2.85 GPa, and the reduced modulus $E_{NCG}$ of the cured film (a-2-AIR) was 3.47 GPa. The ratio $E_{CG}/E_{NCG}$ was 0.82.

(4) Observation of Nanoimprint Pattern

The nanoimprint pattern formed by the photocurable composition (a-2) for imprint as in Example 1 was a satisfactory pattern substantially not having pattern destruction at an exposure dose of 500 mJ/cm².

Example 3

(1) Preparation of Photocurable Composition (a-3) for Imprint

A photocurable composition (a-3) for imprint was prepared using the compounds shown below as the component (A) and using the same components (B) and C) as those in Example 1.

(1-1) Component (A): 100 Parts by Weight in Total, Composed of:

A-1: isobornyl acrylate (manufactured by Kyoeisha Chemical Co., Ltd., trade name: IB-XA): 50 parts by weight, and A-2: m-xylylene diacrylate represented by Formula (5) (manufactured by NARD institute, Ltd.): 50 parts by weight.

Example 4

(1) Preparation of Photocurable Composition (a-4) for Imprint

A photocurable composition (a-4) for imprint was prepared using the compounds shown below as the component (A) and using the same components (B) and (C) as those in Example 1.

(1-1) Component (A): 100 Parts by Weight in Total, Composed of:

A-1: dicyclopentenyl acrylate (manufactured by NARD institute, Ltd.): 50 parts by weight, and A-2: m-xylylene diacrylate represented by Formula (5) (manufactured by NARD institute, Ltd.): 50 parts by weight.

Example 5

(1) Preparation of Photocurable Composition (a-5) for Imprint

A photocurable composition (a-5) for imprint was prepared using the compounds shown below as the component (A) and using the same components (B) and (C) as those in Example 1.

(1-1) Component (A): 100 Parts by Weight in Total, Composed of:

A-1: isobornyl acrylate (manufactured by Kyoeisha. Chemical Co., Ltd., trade name: IB-XA): 50 parts by weight, and A-2: phenylethylene glycol diacrylate represented by Formula (4) (manufactured by NARD institute. Ltd.): 50 parts by weight.

Example 6

(1) Preparation of Photocurable Composition (a-6) for Imprint

A photocurable composition (a-6) for imprint was prepared using the compounds shown below as the component (A) and using the same components (B) and (C) as those in Example 1.

(1-1) Component (A): 100 Parts by Weight in Total, Composed of:

A-1: benzyl acrylate (manufactured by Osaka Organic Chemical Industry, Ltd., trade name: V #160): 50 parts by weight, and A-2: m-xylylene diacrylate represented by Formula (5) (manufactured by NARD institute, Ltd.): 50 parts by weight.

Example 7

(1) Preparation of Photocurable Composition (a-7) for Imprint

A photocurable composition (a-7) for imprint was prepared using the compounds shown below as the component (A) and using the same components (B) and (C) as those in Example 1.

(1-1) Component (A): 100 Parts by Weight in Total, Composed of:

A-1: benzyl acrylate (manufactured by Osaka Organic Chemical Industry, Ltd., trade name: V #160): 50 parts by weight, and A-2: phenylethylene glycol diacrylate represented by Formula (4) (manufactured NARD institute, Ltd.): 50 parts by weight.

Comparative Example 1

(1) Preparation of Photocurable Composition (b-1) for Imprint

A photocurable composition (b-1) for imprint was prepared as in Example 1 except that the component (A) composed of the following compounds was used.

(1-1) Component (A): 94 Parts by Weight in Total, Composed of:

A-3: isobornyl acrylate (manufactured by Kyoeisha Chemical Co., Ltd., trade name: IB-XA): 9 parts by weight, A-4: benzyl acrylate (manufactured by Osaka Organic Chemical Industry, Ltd., trade name: V #160): 38 parts by weight, and A-5: neopentyl glycol diacrylate (manufactured by Kyoeisha Chemical Co., Ltd., trade name: NP-A): 47 parts by weight.

(1-2) Component (B): 3 Parts by Weight in Total, Composed of:

B-1: Lucirin TPO represented by Formula (6) (manufactured by BASF Japan Ltd.): 3 parts by weight.

(1-3) Component (C): 0.5 Parts by Weight in Total, Composed of:

C-1: 4,4'-bis(diethylamino)benzophenone represented by Formula (8) (manufactured by Tokyo Chemical Industry Co., Ltd.): 0.5 parts by weight.

(2) Production of Cured Film of Photocurable Composition (b-1) for Imprint in Condensable Gas Atmosphere and in Non-Condensable Gas Atmosphere A cured film (b-1-PFP) and a cured film (b-1-AIR) were produced from the photocurable composition (b-1) for imprint as in Example 1 in a PFP atmosphere and in an air atmosphere, respectively.

(3) Measurement of Reduced Modulus of Cured Film

As in Example 1, the composite moduli of elasticity of the resulting cured films (b-1-PFP) and (b-1-AIR) were measured. The reduced modulus $E_{CG}$ of the cured film (b-1-PFP) was 1.53 GPa, and the reduced modulus $E_{NCG}$ of the cured film (b-1-AIR) was 3.14 GPa. The ratio $E_{CG}/E_{NCG}$ was 0.49.

(4) Observation of Nanoimprint Pattern

The nanoimprint pattern formed by the photocurable composition (b-1) for imprint as in Example 1 had pattern destruction at an exposure dose of 500 mJ/cm$^2$.

Comparative Example 2

(1) Preparation of Photocurable Composition (b-2) for Imprint

A photocurable composition (b-2) for imprint was prepared as in Example 1 except that the components (A) and (B) composed of the following compounds were used and that the component (C) was not used.

(1-1) Component (A): 100 Parts by Weight in Total, Composed of:

A-1: isobornyl acrylate (manufactured by Kyoeisha Chemical Co., Ltd., trade name: IB-XA): 50 parts by weight, and A-2: m-xylylene diacrylate represented by Formula (5) (manufactured by NARD institute, Ltd.): 50 parts by weight.

(1-2) Component (B): 3 Parts by Weight, Composed of:

B-2: Irgacure 369 (manufactured by BASF Japan Ltd.): 3 parts by weight.

TABLE 1

| | Photocurable composition | $E_{CG}$ (GPa) | $E_{NCG}$ (GPa) | $E_{CG}/E_{NCG}$ | Imprint pattern in PFP atmosphere |
|---|---|---|---|---|---|
| Example 1 | a-1 | 3.32 | 3.82 | 0.87 | ○ |
| Example 2 | a-2 | 2.85 | 3.47 | 0.82 | ○ |
| Example 3 | a-3 | 2.43 | 3.69 | 0.66 | ○ |
| Example 4 | a-4 | 3.11 | 3.94 | 0.79 | |
| Example 5 | a-5 | 2.53 | 3.78 | 0.67 | |
| Example 6 | a-6 | 4.29 | 4.22 | 1.02 | |
| Example 7 | a-7 | 3.79 | 4.31 | 0.88 | |
| Comparative Example 1 | b-1 | 1.53 | 3.14 | 0.49 | x |
| Comparative Example 2 | b-2 | 2.19 | 3.44 | 0.64 | x |

(Note)
Pattern ○: satisfactory pattern not having pattern destruction, and
Pattern x: pattern having a defect of pattern destruction.

That is, it was revealed that the photocurable compositions having a value $E_{CG}$ of larger than 2.30 GPa of Examples 1 to 3 can be produced into cured films not having pattern destruction by an imprint process in a PFP atmosphere, whereas the photocurable compositions having a value $E_{CG}$ of 2.30 GPa or less of Comparative Examples 1 and 2 cause pattern destruction.

It was also revealed that although the value $E_{NCG}$ was 3.0 GPa or more in all of Examples 1 to 3 and Comparative Examples 1 and 2, the imprint process in a PFP atmosphere can produce cured films not having pattern destruction by controlling the ratio $E_{CG}/E_{NCG}$ to 0.65 or more as in Examples 1 to 3.

Furthermore, also in Examples 4 to 7, since the value $E_{CG}$ was larger than 2.2 GPa and the ratio $E_{CG}/E_{NCG}$ was 0.65 or more, satisfactory imprint patterns may be formed in a PFP atmosphere.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photocurable composition for imprint in a condensable gas atmosphere, the composition comprising:
   a polymerizable compound component (A), and
   a photopolymerization initiator component (B), and
   the composition satisfying:
   a value $E_{CG}$ of greater than or equal to 2.30 GPa,
   where $E_{CG}$ denotes the reduced modulus (GPa) of a photocured film prepared by exposing the photocurable composition for imprint to light at an exposure dose of 200 mJ/cm$^2$ in an atmosphere containing a condensable gas in a concentration of 90% by volume or more.

2. The composition for imprint according to claim 1, further satisfying:
   a value $E_{CG}$ of greater than or equal to 2.43 GPa.

3. The composition for imprint according to claim 1, further satisfying:
   a ratio $E_{CG}/E_{NCG}$ of 0.65 or more and 1.1 or less,
   where $E_{NCG}$ denotes the reduced modulus (GPa) of a photocured film prepared by exposing the photocurable composition for imprint to light at an exposure dose of 200 mJ/cm$^2$ in a non-condensable gas atmosphere.

4. A photocurable composition for imprint in a condensable gas atmosphere, the composition comprising:
   a polymerizable compound component (A); and
   a photopolymerization initiator component (B), and
   the composition satisfying:
   a ratio $E_{CG}/E_{NCG}$ of 0.65 or more and 1.1 or less,
   where $E_{CG}$ denotes the reduced modulus (GPa) of a photocured film prepared by exposing the photocurable composition for imprint to light at an exposure dose of 200 mJ/cm$^2$ in a condensable gas atmosphere; and the $E_{NCG}$ denotes the reduced modulus (GPa) of a photocured film prepared by exposing the photocurable composition for imprint to light at an exposure dose of 200 mJ/cm$^2$ in a non-condensable gas atmosphere.

5. The photocurable composition for imprint according to claim 1, wherein the polymerizable compound component (A) is a (meth)acrylic compound.

6. The photocurable composition for imprint according to claim 1, wherein the polymerizable compound component (A) is composed of a monofunctional (meth)acrylic compound and a multifunctional (meth)acrylic compound.

7. The photocurable composition for imprint according to claim 1, wherein at 23 degrees, the composition has a viscosity of 5 mPa*s or more and 12 mPa*s or less.

8. The photocurable composition for imprint according to claim 1, wherein the polymerizable compound component (A) is composed of a monofunctional acrylate selected from the group consisting of isobornyl acrylate, benzyl acrylate, dicyclopentanyl acrylate, and dicyclopentenyl acrylate and a multifunctional acrylate selected from the group consisting of phenylethylene glycol diacrylate and m-xylylene diacrylate.

9. The photocurable composition for imprint according to claim 1, wherein the photopolymerization initiator component (B) is an alkylphenone polymerization initiator or an acylphosphine oxide polymerization initiator.

10. The photocurable composition for imprint according to claim 1, wherein the photopolymerization initiator component (B) is a compound represented by Formula (6):

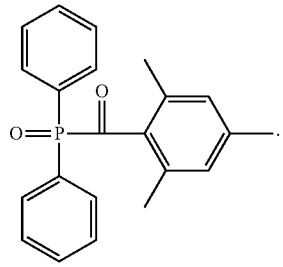

(6)

11. The photocurable composition for imprint according to claim 1, wherein the photopolymerization initiator component (B) is a compound represented by Formula (7):

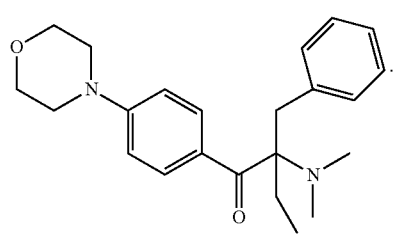

(7)

12. The photocurable composition for imprint according to claim 1, further comprising a sensitizer.

13. The photocurable composition for imprint according to claim 12, wherein the sensitizer is a compound represented by Formula (8):

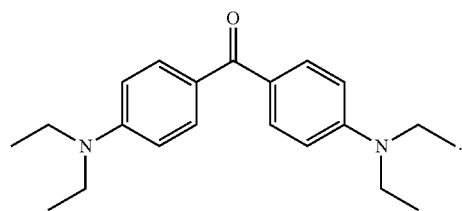

(8)

14. The photocurable composition for imprint according to claim 1, wherein the condensable gas is 1,1,1,3,3-pentafluoropropane (PFP).

15. A method of producing a film having a pattern, the method comprising:
   arranging the photocurable composition for imprint according to claim 1 on a substrate;
   bringing the photocurable composition for imprint and a mold into contact with each other in a gaseous atmosphere containing a condensable gas;
   irradiating the photocurable composition for imprint with light to form into a cured film; and
   detaching the cured film from the mold.

16. The method of producing a film having a pattern according to claim 15, the method further comprising:
   positioning the substrate and the mold being in contact with each other in a condensable gas-containing atmosphere.

17. The method of producing a film having a pattern according to claim 16, wherein the condensable gas-containing atmosphere contains 90% by volume or more of a condensable gas.

18. The method of producing a film having a pattern according to claim 16, wherein the condensable gas is 1,1,1,3,3-pentafluoropropane.

19. A method of producing an optical component, the method comprising:
   a step of preparing a film having a pattern by the method according to claim 15.

20. A method of producing an optical component, the method comprising:
   preparing a film having a pattern by the method according to claim 15; and
   subjecting the substrate to etching or ion implantation using the resulting film having a pattern as a mask.

21. A method of producing a circuit board, the method comprising:
   preparing a film having a pattern by the method according to claim 15; and
   subjecting the substrate to etching or ion implantation using the resulting film having a pattern as a mask.

22. A method of producing an electronic component, the method comprising:
   producing a circuit board by the method according to claim 21; and
   forming an electronic member on the circuit board.

* * * * *